United States Patent
Preusse et al.

(10) Patent No.: US 7,169,664 B2
(45) Date of Patent: Jan. 30, 2007

(54) METHOD OF REDUCING WAFER CONTAMINATION BY REMOVING UNDER-METAL LAYERS AT THE WAFER EDGE

(75) Inventors: Axel Preusse, Radebeul (DE); Markus Nopper, Dresden (DE); Holger Schührer, Dresden (DE)

(73) Assignee: Advanced Micro Devices, Inc., Austin, TX (US)

(*) Notice: Subject to any disclaimer, the term of this patent is extended or adjusted under 35 U.S.C. 154(b) by 67 days.

(21) Appl. No.: 10/747,722

(22) Filed: Dec. 29, 2003

(65) Prior Publication Data

US 2004/0251518 A1 Dec. 16, 2004

(30) Foreign Application Priority Data

Jun. 11, 2003 (DE) .......................... 103 26 273

(51) Int. Cl.
*H01L 29/72* (2006.01)

(52) U.S. Cl. .................. 438/244; 438/310; 438/311; 438/422; 438/691; 438/692; 438/745; 134/148; 134/153; 134/902

(58) Field of Classification Search ............. 438/244, 438/310, 311, 422, 691, 692, 745; 134/148, 134/153, 902
See application file for complete search history.

(56) References Cited

U.S. PATENT DOCUMENTS

| | | | |
|---|---|---|---|
| 5,091,047 A | 2/1992 | Cleeves et al. ............ 156/643 |
| 5,340,435 A | 8/1994 | Ito et al. ................. 156/632 |
| 5,966,628 A | 10/1999 | Wei et al. ................ 438/584 |
| 6,150,696 A | 11/2000 | Iwamatsu et al. ......... 257/347 |
| 6,265,314 B1 | 7/2001 | Black et al. .............. 438/690 |
| 6,451,696 B1 * | 9/2002 | Hara et al. ............... 438/691 |
| 6,589,875 B1 | 7/2003 | Bode et al. ............... 438/697 |
| 6,615,854 B1 * | 9/2003 | Hongo et al. ............. 134/148 |
| 6,784,051 B2 * | 8/2004 | Lee ......................... 438/244 |

OTHER PUBLICATIONS

Wolf et al., Silicon Processing for the VLSI Era, vol. 1: Process Technology, pp. 400–403 and 532–533, 1986.

* cited by examiner

*Primary Examiner*—Edward Wojciechowicz
(74) *Attorney, Agent, or Firm*—Williams, Morgan & Amerson, P.C.

(57) ABSTRACT

According to the present invention, a metal and a barrier material, such as copper and a tantalum-based barrier material, are effectively removed from the wafer edge and especially from the bevel by using an etchant that comprises a diluted mixture of hydrofluoric acid and nitric acid. The method is compatible with currently available etch modules for removing metal from the wafer edge, wherein, depending on the hardware specifics, copper, barrier material and dielectric material may be removed in a single etch step, or a first etch step may be performed substantially without any nitric acid so as to avoid the formation of nitric oxides. In this way, the formation of instable layer stacks may be substantially avoided, thereby reducing the risk of material delamination from the substrate edge.

17 Claims, 4 Drawing Sheets

METHOD OF REDUCING WAFER CONTAMINATION BY REMOVING UNDER-METAL LAYERS AT THE WAFER EDGE

BACKGROUND OF THE INVENTION

1. Field of the Invention

Generally, the present invention relates to the fabrication of integrated circuits, and, more particularly, to the formation of metallization layers and substrate contaminations related thereto that are created during subsequent processes.

2. Description of the Related Art

Semiconductor devices are typically formed on substantially disc-shaped substrates made of any appropriate material. The majority of semiconductor devices including highly complex electronic circuits currently is, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs ASICs (application specific ICs) and the like. The individual integrated circuits are arranged in an array form, wherein most of the manufacturing steps, which may add up to 500 and more individual process steps in sophisticated integrated circuits, are performed simultaneously for all chip areas on the substrate, except for photolithography processes, metrology processes and packaging of the individual devices after dicing the substrate. Thus, economical constraints drive semiconductor manufacturers to steadily increase the substrate dimensions, thereby also increasing the area available for producing actual semiconductor devices.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the peripheral chip areas are positioned as closely as possible to the substrate perimeter as it is compatible with substrate handling processes. Generally, most of the manufacturing processes are performed in an automated manner, wherein the substrate handling is performed at the back side of the substrate and/or the substrate edge, which typically includes a bevel at least at the front side of the substrate.

Due to the ongoing demand for shrinking the feature sizes of highly sophisticated semiconductor devices, copper, possibly in combination with a low-K dielectric material, has become a frequently used alternative in the formation of so-called metallization layers, which include metal lines and vias connecting individual circuit elements to provide the required functionality of the integrated circuit. Although copper exhibits significant advantages when compared to aluminum as being the typical metallization metal for the last decade, semiconductor manufacturers have been somewhat reluctant to introduce copper, owing to copper's ability to readily diffuse in silicon and silicon dioxide. Moreover, even when being present in very small amounts, copper may significantly modify the electrical characteristics of silicon and, thus, the behavior of circuit elements, such as transistors, and the like. It is, therefore, essential to confine the copper to the metal lines and vias by using appropriate insulating and conductive barrier layers so as to strongly suppress the diffusion of copper into sensitive device regions. Furthermore, any contamination of process tools, such as transport means, transport containers, robot arms, wafer chucks and the like, must effectively be restricted, since even minute amounts of copper deposited on the backside of a substrate may lead to diffusion of the copper into sensitive device areas.

The problem of copper contamination is even exacerbated when low-K dielectric materials are employed in combination with copper to form metallization layers, owing to the reduced mechanical stability of the porous low-K dielectrics. Since at least some of the deposition processes used in fabricating semiconductors may not efficiently be restricted to the "active" substrate area, a stack of layers or material residues may also be formed at the substrate edge region including the bevel, thereby generating a mechanically unstable layer stack owing to process non-uniformities at the substrate edge and especially at the bevel of the substrate. During the further production and substrate handling processes, material such as copper and/or the dielectrics may delaminate and significantly affect these processes.

For instance, in forming a copper-based metallization layer, the so-called damascene technique is presently a preferred manufacturing method to create metal lines and vias. To this end, a dielectric layer, possibly comprised of a low-K dielectric, is deposited and patterned so as to include trenches and vias in accordance with design requirements. Thereafter, a conductive barrier layer comprised of, for example, tantalum, tantalum nitride, titanium, titanium nitride and the like, is deposited, wherein the composition of the barrier layer is selected so as to also improve the adhesion of the copper to the neighboring dielectric. The deposition of the barrier layer may be accomplished by chemical vapor deposition (CVD) or physical vapor deposition (PVD), wherein a deposition of the barrier material may not be efficiently restricted to the active substrate area by presently established deposition techniques. Consequently, the barrier material may also be deposited at the substrate bevel and partially at the back side of the substrate. Thereafter, according to a standard damascene process flow, a thin copper seed layer is deposited by physical vapor deposition or similar appropriate processes to initiate and promote a subsequent electrochemical deposition process to fill the trenches and vias formed in the dielectric material.

Although reactor vessels for the electrochemical deposition, such as electroplating reactors or electroless plating reactors, may be designed such that substantially no copper is deposited at the substrate edge, the preceding seed layer deposition may nevertheless result in a significant deposition of unwanted copper at the substrate edge region. After the electrochemical deposition of the bulk copper, any excess material has to be removed, which is frequently achieved by chemical mechanical polishing (CMP), wherein material fragments, such as copper pieces, may "flake off," owing to the reduced stability of the metallization layer stack, especially at the substrate bevel. The copper-containing material flakes, liberated during the CMP process, may then redeposit at unwanted substrate regions or may affect the CMP process of subsequent substrates. During the further processing of the substrate, a copper contamination, mainly caused by the copper delamination at the substrate edge, may occur and may especially adversely affect the so-called back end process flow, in which contact pads and solder bumps are formed. In particular, an electrochemical reaction between copper and aluminum that is used to manufacture the contact pads may result in a so-called pitting reaction, thereby significantly deteriorating the reliability of the completed semiconductor device.

Since copper contamination caused by unwanted copper at the substrate edge has been identified as a major contamination source, great efforts are being made to remove copper from the substrate edge and the bevel substantially without affecting the inner, i.e., the active, substrate region. To this end, etch modules have been developed by semiconductor equipment providers, such as Semitool Inc., Novellus Inc. and the like, which are configured to selectively provide an agent substantially comprised of sulfuric acid and hydrogen peroxide to the substrate edge so as to remove unwanted copper from this region. Although the removal of unwanted copper from the substrate edge reduces the risk of copper contamination of subsequent processes, it turns out, however, that still a significant reduction of production yield, especially in the back end process flow, is observable.

In view of the problems identified above, a need exists, therefore, to provide an improved technique for reducing contamination and/or mechanical defects caused by delamination of dielectrics.

SUMMARY OF THE INVENTION

Generally, the present invention is directed to a method to selectively remove unwanted material from an edge region of a substrate, wherein, after formation of a metallization layer, not only unwanted metal, such as copper, but also at least the underlying barrier layer is substantially completely removed. The removal of at least the layer immediately following the copper layer may reduce the build up of mechanically unstable layers during the manufacturing of a plurality of metallization layers, thereby significantly reducing the probability of delamination and, thus, copper contamination of subsequent processes. The selective removal of unwanted material may be accomplished by using an etchant that is substantially comprised of a diluted mixture of hydrofluoric acid and nitric acid. If desired, the dielectric material below the barrier layer may also be removed at the substrate edge so as to finally expose the substrate surface, thereby further reducing the risk of mechanical defects and thus substrate contamination caused by delamination of dielectrics in manufacturing and substrate handling processes.

In one illustrative embodiment of the present invention, a method comprises the selective application of one or more etchants to an edge region of a substrate, which has a central region adjacent to the edge region. Moreover, a metallization layer stack is formed at least on the central region, wherein the metallization layer stack comprises at least an insulating layer, a barrier layer and a metal layer. Then, unwanted material at least from the metal layer and the barrier layer is selectively removed from the edge region.

In accordance with still another illustrative embodiment of the present invention, a method of reducing contamination of a substrate after formation of a metallization layer stack on the substrate is provided. The method comprises the selective removal of unwanted material from an edge region of the substrate by using a first etchant comprising a diluted compound of nitric acid and hydrofluoric acid as the main component.

In a further illustrative embodiment of the present invention, a semiconductor structure comprises a substrate having a front side and a back side, wherein the front side is divided into a device region and an edge region. Furthermore, a plurality of semiconductor devices are formed in and over the device region, wherein each semiconductor device comprises at least one metallization layer including a dielectric layer and a metal line, the metal line being formed in the dielectric layer and being separated therefrom by a conductive barrier layer. The semiconductor structure is characterized in that the edge region is substantially devoid of material of the metal line, the barrier layer and the dielectric layer.

BRIEF DESCRIPTION OF THE DRAWINGS

The invention may be understood by reference to the following description taken in conjunction with the accompanying drawings, in which like reference numerals identify like elements, and in which.

Figure 1A:
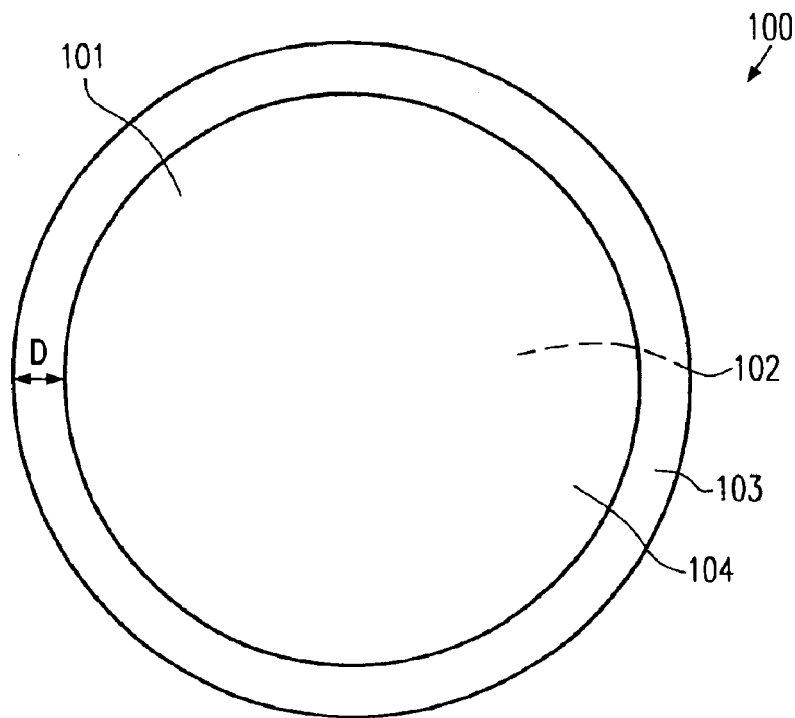
FIG. 1a schematically depicts a top view of a substrate including a device bearing an "active" region and an edge region.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

With reference to FIGS. 1a–1g, further illustrative embodiments of the present invention will be described in more detail below. It should be noted that the present invention is particularly advantageous in the context of metallization layers including copper and a low-K dielectric material, since delamination of mechanically fragile low-K dielectric layers may lead to an increased contamination of subsequent processes, as previously pointed out. The present invention may, however, also be applied in combination with other metallization schemes, such as aluminum-based metallization layers and the like, thereby improving production yield due to a significant reduction of the particles created by substrate handling processes, CMP processes and the like. Moreover, by removing unwanted material including, contrary to the conventional approach, in addition to metal, also the barrier layer, and, in one particular embodiment, an underlying dielectric layer, the safety margin for an unused area at the periphery of the substrate may be decreased, thereby providing more substrate area that is available for actual semiconductor devices.

FIG. 1a schematically depicts a substrate 100 having a front side 101, on which circuit elements are to be formed, and a back side 102, which is frequently in contact with any type of substrate holders during transport and processing of the substrate 100. The front side 101 of the substrate 100 may be divided into an "active" or device region 104, within which the plurality of individual chip areas are to be arranged, and into an edge region 103, which may not be used for the fabrication of circuit elements due to process non-uniformities, especially occurring at the vicinity of the substrate perimeter. The size of the edge region 103 and thus of the device region 104 depends on the controllability of the processes involved in manufacturing circuit elements on the device region 104, the capability of transport means used for supporting and transporting the substrate 100 between subsequent processes and the like. Desirably, the size of the edge region 103 is kept as small as possible to arrange as many chip areas as possible on the device region 104. Presently, 200 mm and 300 mm are typical diameters of substrates used in modern semiconductor facilities, wherein a size D of the edge region 103 may range from approximately 1–5 mm. The principles of the present invention, however, are not restricted to a specific size of the substrate 100 and the edge region 103. The edge region 103 typically comprises a bevel, as will be described in more detail in FIG. 1b.

Figure 1B:
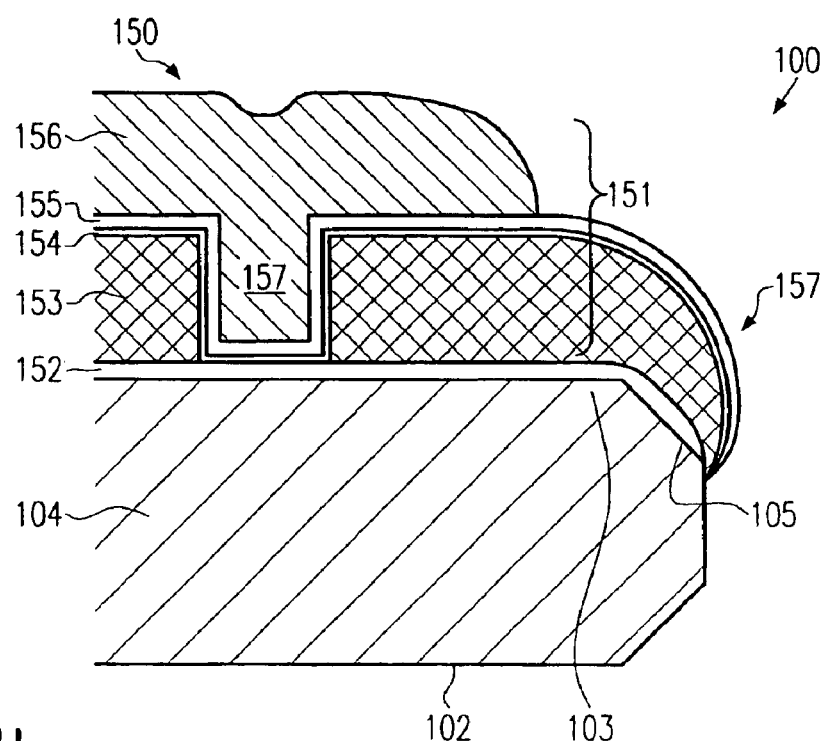
FIGS. 1b–1g schematically show cross-sectional views of a part of the substrate of FIG. 1a, wherein various steps in removing unwanted material from the edge region during the formation of one or more metallization layers are illustrated in accordance with illustrative embodiments of the present invention.

FIG. 1b schematically shows a cross-sectional view of a portion of the substrate 100 including the edge region 103 having formed therein the bevel 105. A layer stack 150 comprising a first metallization layer 151 and an insulating layer 152 is formed at least over the device region 104, wherein some or all of the individual layers of the layer stack 150 may extend into the edge region 103 and possibly across the bevel 105. The insulating layer 152 may represent a passivation layer formed above circuit elements (not shown) or may represent an etch stop layer used for the formation of the metallization layer 151. Within and below the insulating layer 152, circuit elements including contact regions may be formed which, for convenience, are not shown. The metallization layer 151 comprises a second insulating layer 153 that may be comprised of a low-K dielectric material. A trench 157 is formed in the second dielectric layer 153 and is filled with a conductive barrier material, a seed layer material and a metal, such as copper, all of which are provided in the form of a barrier layer 154, a seed layer 155 and a metal layer 156, respectively.

The layer stack 150 may be formed in accordance with well-established photolithography, deposition and etch techniques as previously explained and a detailed description thereof is omitted here in order to not unduly obscure the principles of the present invention.

As previously explained, the processes for depositing the metallization layer 151 may be partly designed so as provide unwanted material even within the edge region 103 and the bevel 105 in an attempt to increase the device region 104 as much as possible. Moreover, in some deposition techniques, such as sputter deposition and CVD, it may be difficult to precisely restrict, for example, the barrier layer 154, the seed layer 155 and the dielectric layer 153 to the device region 104. In particular, at an area 157 in the vicinity of the bevel 105, process non-uniformities during depositing of the barrier layer 154 and/or the seed layer 155 and/or the dielectric layer 153 may result in a non-uniform layer stack having reduced mechanical stability owing to the modified adhesion characteristics of the barrier layer 154 and the seed layer 155. Furthermore, dielectric material of the dielectric layer 153 may also be deposited on the bevel 105 which may further contribute to the mechanical weakness of the layer stack over the bevel 105 due to the inherent reduced mechanical strength of the dielectric layer 153, if it is provided as a low-K material such as SiCOH and the like, and owing to a reduced thickness and non-uniformities during the deposition process. As a consequence, parts of the layer stack 150, located over the bevel 105, may delaminate and may adversely affect subsequent processes, especially processes involved in the back end process flow. Contrary to the conventional approach, the present invention is based on the consideration that at least the seed layer 155 and possibly any residuals of the metal layer 156 and the barrier layer 154 should be removed substantially completely, at least at the bevel 105, so as to minimize the risk of contamination of subsequent processes, since even after a conventional metal removal, there may still be tiny amounts of metal present, which may then be liberated upon delamination of the barrier layer 154 and/or the dielectric layer 153.

Figure 1C:
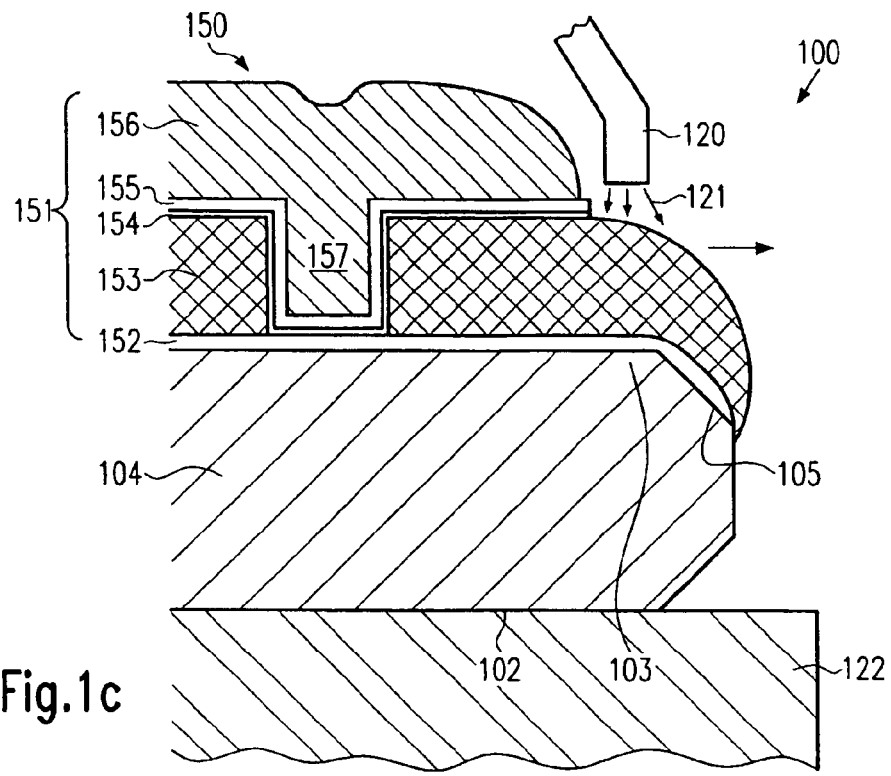

FIG. 1c schematically shows the substrate 100 when exposed to an etch process for substantially removing at least the seed layer 155, including any residuals of the metal layer 156, and the barrier layer 154 over the edge region 103. The substrate 100 may be placed on a substrate holder 122 of an appropriate etch module (not shown) that is configured to selectively supply an etchant 121, for example by means of a nozzle 120. The nozzle 120 and the substrate holder 122 may be configured to hold and rotate the substrate 100 with an appropriate speed so as to exert a centrifugal force to the etchant 121, thereby substantially avoiding contact of the etchant 121 with material located above the device region 104. An appropriate etch module allowing the selective application of the etchant 121 is, for example, available from Semitool Inc. under the trademark "Capsule." It should be noted, however, that the present invention is not restricted to any particular etch tool and may be practiced with any suitable etch tool that is presently available on the market. The only requirement is a sufficient inertness of the components of the etch module with respect to the etchant 121.

In one particular embodiment, the etchant 121 may be comprised of a diluted mixture of hydrofluoric acid (HF) and nitric acid ($HNO_3$). The ratio of de-ionized water, hydrofluoric acid and nitric acid may be selected in accordance with the desired etch rate for a specified material, for instance copper and tantalum being present in the seed layer 155 and the barrier layer 154, respectively. For instance, de-ionized water, 79 wt/% $HNO_3$ and 49 wt/% HF may be mixed in a ratio of approximately 10:1:8 in parts by volume, and in another embodiment as a ratio of approximately 14:1:2. Moreover, the temperature of the etchant 121 may be adjusted for the above-identified mixtures to approximately 25–35° C. Advantageously, the temperature of the substrate 100 may also be adjusted to the above-referenced temperature range so as to attain a required etch rate.

In one illustrative embodiment, the substrate 100 is etched in a substantially closed or protected environment so as to substantially avoid the emission of toxic etch byproducts. For instance, the metallization layer 151 may comprise copper which may produce nitric oxide during the reaction with the etchant 121, if the etchant 121 contains nitric acid. The gaseous ambient enclosed in the etch module may then continuously, or after the completion of the etch process, be reworked in that nitric oxides may be converted into non-toxic products by, for example, a catalytic material. Using a diluted mixture of HF and $HNO_3$, though it may produce nitric oxide, enables the removal of, for example, copper and tantalum based barrier material in a common etch process.

In a further illustrative embodiment, the etchant 121 may be configured so as to substantially remove copper substantially without producing nitric oxides. To this end, the etchant 121 may comprise a mixture of sulfuric acid and hydrogen peroxide and the like. Thereafter, a second etchant may be supplied to the edge region 103, wherein one or more rinsing steps may be performed to remove the etchant 121 and by-products of the preceding copper etch process. The second etchant may then be comprised of a diluted mixture of hydrofluoric acid and nitric acid, in a ratio as it is, for example, specified above or at any other ratio that is deemed appropriate. With the second etchant, at least the barrier layer 154 may be removed above the edge region 103 and especially at the bevel 105. By removing the barrier layer 154, irrespective whether in a one-step etch process by providing the etchant 121 as a diluted mixture of hydrofluoric acid and nitric acid, or by a multi-step etch process with copper removal substantially without nitric acid, the probability of copper contamination of the substrate 100 in subsequent processes and contamination of wafer handling components is significantly reduced compared to the conventional approach, in which the barrier layer 154 remains substantially in tact.

Moreover, in some embodiments, it may be advantageous to also supply the etchant 121 at the back side 102 of the substrate 100 so as to remove metal and barrier layer material that may have been deposited during the sputter deposition process in forming the layers 154 and 155. In removing material from the back side 102, the same criteria apply as previously pointed out with reference to etching the edge region 103. That is, the material may be removed in a single etch process by supplying a diluted mixture of hydrofluoric acid and nitric acid, or copper may be removed in an initial etch step in the absence of nitric acid so as to substantially avoid the generation of nitric oxide. Typically, available etch tools as are used for copper removal at the edge region 103 may also be configured to enable the etching of the back side 102.

Figure 1D:
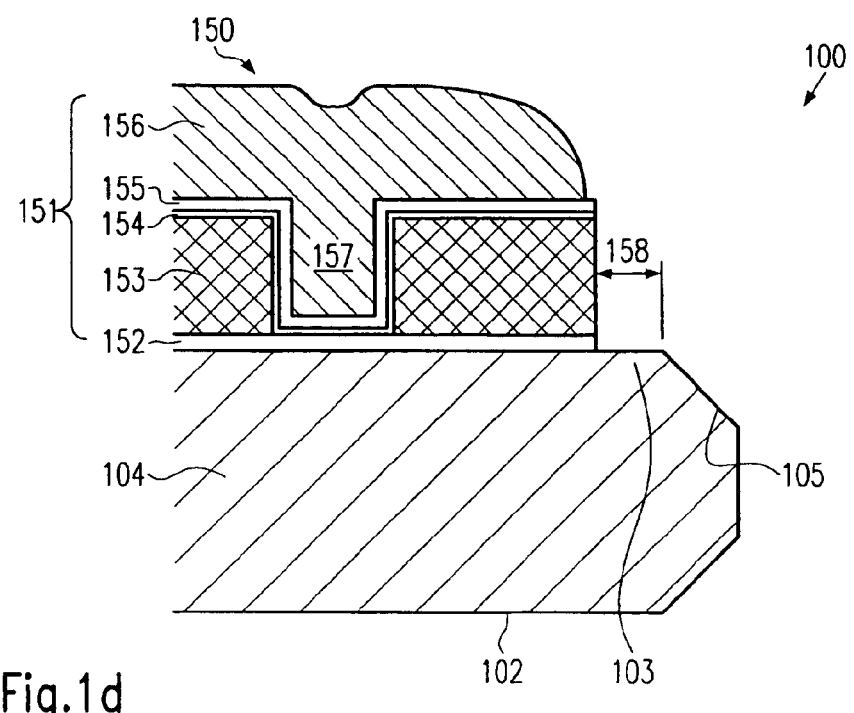

FIG. 1*d* schematically shows a cross-sectional view of the substrate 100 in accordance with one particular embodiment of the present invention. In FIG. 1*d*, the etch process in the presence of a diluted mixture of hydrofluoric acid and nitric acid has been continued so as to also remove the dielectric layer 153, and, in further embodiments, the etch process may be continued so as to also remove any underlying layer, such as the dielectric layer 152, to finally substantially expose the substrate surface of the region 103 and the bevel 105. For instance, if the substrate 100 represents a silicon substrate or an SOI substrate, a blank silicon surface is exposed, which significantly reduces the possibility of contamination of subsequent processes and also provides a mechanically stable substrate edge region 103. A lateral extension 158 of the edge region 103 may be appropriately defined by the selective application of the etchant 121 (see FIG. 1*c*), since a relatively sharp boundary between the device region 104 and the edge region 103 may be obtained by etching through the dielectric layers 153 and 152. The extension 158 may be reduced compared to a conventional edge treating process due to the lack of a transition region, between the device region 104 and the edge region 103, having a reduced mechanical stability. Thus, the lateral extension 158 may be selected so as to be compatible with substrate handling tools substantially without requiring process margins that take into account delamination of fragments of the dielectric layer 153. Thus, according to the present invention, the device region 104 may be increased while, nevertheless, contamination of subsequent processes and process tools is still reduced.

Figure 1E:
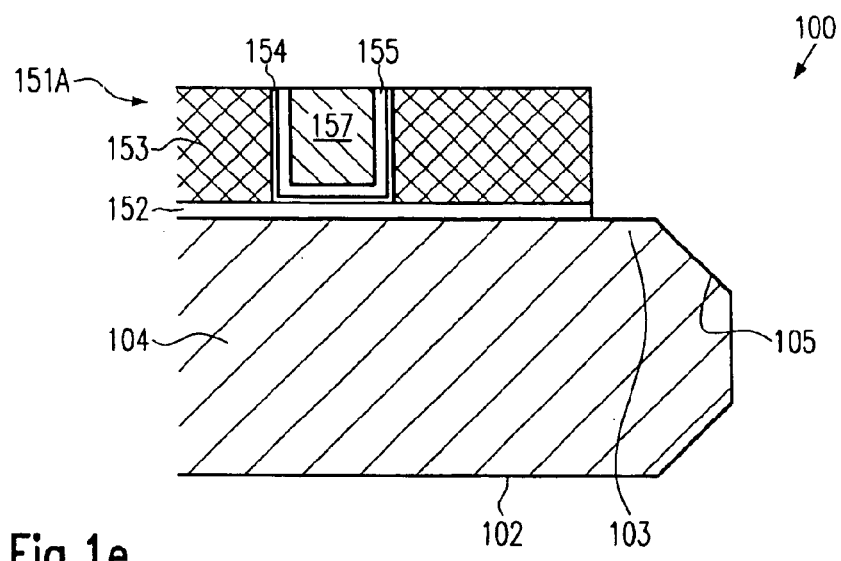

FIG. 1*e* schematically shows the substrate 100 after the removal of excess material of the metal layer 156 (see FIG. 1*d*) by CMP, wherein, additionally, the seed layer 155 and the barrier layer 154 outside the trench 157 have been removed so as to provide a planarized metallization layer 151A. As previously explained, the risk of material delamination and, thus, of copper contamination is significantly reduced due to the removal of metal and barrier layer material, especially at the bevel 105 and above the edge region 103. In the particular embodiment in which the substrate surface is substantially exposed by also removing the dielectric layers 153 and 152, which may partially be comprised of a low-K dielectric, as shown in FIG. 1*e*, a still further improved reduction of contamination is achieved due to the substantially "inert" surface area on the edge region 103 and the bevel 105.

Figure 1F:
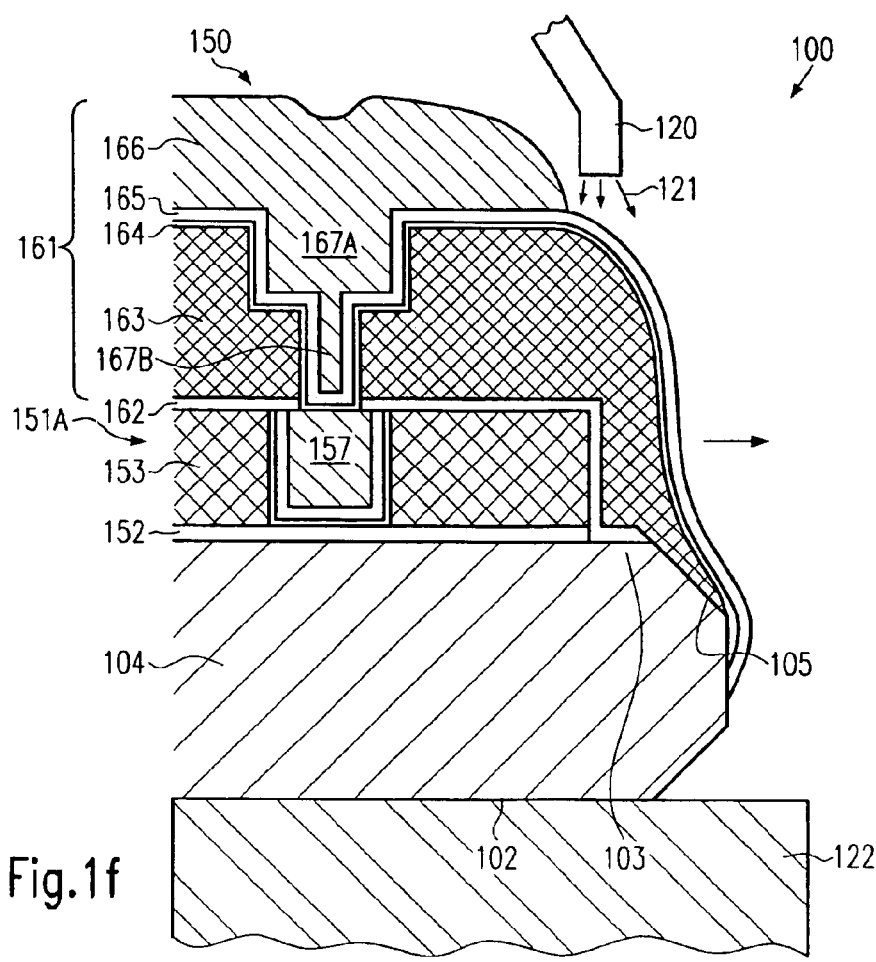

FIG. 1*f* schematically shows the substrate 100 after the formation of a second metallization layer 161 on top of the planarized first metallization layer 151A when subjected to an etch process that is similar to the process as described with reference to FIG. 1*c*. The second metallization layer 161 may comprise a dielectric etch stop layer 162 followed by a dielectric layer 163, wherein, for example, the dielectric layers 162 and 163 may be comprised of a low-K dielectric. A trench 167A and a via 167B are formed in the dielectric layer 163, the sidewalls of which are covered by a barrier layer 164 followed by a seed layer 165. Finally, a metal layer 166, for example comprised of copper, is formed above the trench 167A.

As previously explained with reference to FIG. 1*b*, dielectric material of the layers 162, 163, as well as the conductive material of the barrier layer 164, comprised of, for instance, tantalum and/or tantalum nitride, and of the seed layer 165 may also have been deposited on the edge region 103 and the bevel 105. Thus, a further etch process may be performed using an etch module as is described with reference to FIG. 1*c* so as to provide one or more etchants at the edge region 103 in order to remove unwanted metal and barrier layer material and dielectric material from the edge region 103 and especially from the bevel 105. Regarding the etch strategy and the etchants used therein, the same criteria apply as previously outlined with reference to FIG. 1*c*.

Figure 1G:
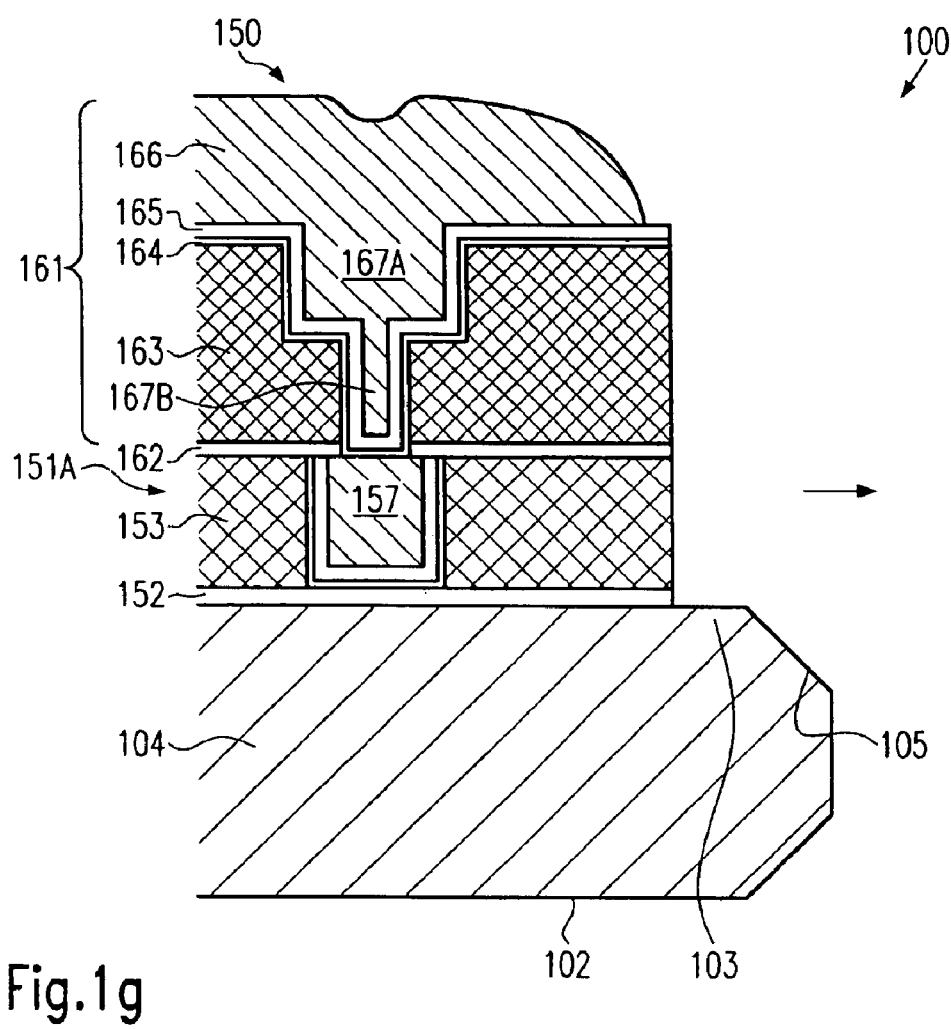

FIG. 1*g* schematically shows the substrate 100 after completion of the etch process, wherein material on the bevel 105 and on the edge region 103 is effectively removed so as to substantially expose the substrate surface. The further processing of the substrate 100 as shown in FIG. 1g may be continued with a further CMP process so as to remove excess material of the metal layer 166 and to planarize the metallization layer 161. Again, the substantially cleared bevel 105 and the effective material removal on the edge region 103 provide a significantly reduced contamination rate compared to conventional processing. Moreover, during further processing of the substrate 100 in forming contact pads and solder bumps, especially the effective clearance of the bevel 105, significantly reduces material delamination and, thus, contamination of subsequent processes, especially when the metallization layers 161 and 151A comprise copper.

Electron excited x-ray fluorescence measurements of a plurality of test substrates comprising a metallization layer stack including a low-K dielectric material on the basis of silicon oxide, such as SiCOH, a tantalum-containing barrier layer and a copper metal layer confirmed that substantially no traces of copper, tantalum and oxygen were present on the bevel 105 while only negligible amounts of tantalum and oxygen could be traced on the edge region 103. Thus, the measurement revealed that copper can efficiently be removed from critical substrate regions, such as the bevel 105 and the edge region 103, thereby significantly reducing copper contamination of subsequent processes and process tools. Moreover, by performing an etch process, which, in accordance with one particular embodiment, is designed to remove substantially dielectric materials, in particular mechanically weak low-K dielectrics, after the completion of a metallization layer, the formation of mechanically weak layer stacks, at the substrate perimeter, may be eliminated, thereby reducing the risk of material delamination in subsequent processes. The relatively sharp boundary created by etching through the dielectrics, possibly down to the substrate surface, provides the potentiality of defining the size of the edge region 103 in conformity with tool specifications regarding the required "space" at the substrate front side 101 for a correct substrate handling. Thus, the valuable substrate area available for actual semiconductor devices may be increased for a given substrate size compared to the conventional technique.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    selectively applying a single etchant comprising a diluted compound of nitric acid and hydrofluoric acid to an edge region of a substrate, said substrate having a central region adjacent to said edge region, wherein a metallization layer stack is formed at least on said central region, said metallization layer stack comprising at least an insulating layer, a barrier layer comprising tantalum and a metal layer comprising copper; and
    removing unwanted material at least of said metal layer and said barrier layer selectively from said edge region, wherein said single etchant is applied to remove material of said metal layer and said barrier layer.

2. The method of claim 1, further comprising removing material of said insulating layer selectively from said edge region.

3. The method of claim 1, wherein said substrate is exposed in said edge region during said material removal.

4. The method of claim 1, further comprising applying said single etchant at the back side of said substrate to remove unwanted material.

5. The method of claim 1, wherein said metal layer comprises copper and is formed by an electro-chemical process.

6. A method of reducing contamination of a substrate after formation of a metallization layer stack on said substrate, the method comprising:
    selectively removing unwanted material of a metal layer comprising copper and a barrier layer comprising tantalum from an edge region of said substrate by using a first etchant comprising a diluted compound of nitric acid and hydrofluoric acid as the main component; and
    removing unwanted metal of said metal layer with a second etchant other than said first etchant from said edge region prior to selectively removing unwanted material with said first etchant.

7. The method of claim 6, wherein at least material of a barrier layer of said metallization layer stack is removed.

8. The method of claim 7, wherein dielectric material is removed so as to expose said substrate at said edge region.

9. The method of claim 6, wherein unwanted metal of said metallization layer is removed.

10. The method of claim 6, further comprising removing unwanted material from a back side of said substrate.

11. A method, comprising:
    selectively applying a single etchant comprising a diluted mixture of hydrofluoric acid and nitric acid to an edge region of a substrate, said substrate having a central region adjacent to said edge region, wherein a metallization layer stack is formed at least on said central region, said metallization layer stack comprising at least an insulating layer, a barrier layer and a metal layer, wherein applying said single etchant is performed in an substantially air-tight ambient to substantially avoid the emission of gaseous nitric oxides; and
    applyingi said single etchant to remove removing unwanted material at least of said metal layer and said barrier layer selectively from said edge region.

12. The method of claim 11, further comprising removing material of said insulating layer selectively from said edge region.

13. The method of claim 11, further comprising applying said single etchant at the back side of said substrate to remove unwanted material.

14. The method of claim 11, wherein said metal layer is formed by an electro-chemical process.

15. A method of reducing contamination of a substrate after formation of a metallization layer stack on said substrate, said metallization layer comprising copper, the method comprising:
    selectively removing unwanted material from an edge region of said substrate by using a first etchant comprising a diluted compound of nitric acid and hydrofluoric acid as the main component, wherein said selective removal of unwanted material with said first etchant is performed in a protected environment to substantially avoid liberation of gaseous nitric oxide, wherein at least material of a barrier layer of said metallization layer stack and copper of said metallization layer is removed.

16. The method of claim 15, wherein dielectric material is removed so as to expose said substrate at said edge region.

17. The method of claim 15, further comprising removing unwanted metal with a second etchant other than said first etchant from said edge region prior to selectively removing unwanted material with said first etchant.

* * * * *

UNITED STATES PATENT AND TRADEMARK OFFICE
CERTIFICATE OF CORRECTION

PATENT NO. : 7,169,664 B2
APPLICATION NO. : 10/747722
DATED : January 30, 2007
INVENTOR(S) : Axel Preusse, Markus Nopper and Holger Schührer It is certified that error appears in the above-identified patent and that said Letters Patent is hereby corrected as shown below:

Col. 10, line 10 (claim 5, line 2), delete "comprises copper and".

Col. 10, line 39 (claim 11, line 8), after "barrier layer" insert -- comprising tantalum --.

Col. 10, line 40 (claim 11, line 9), after "layer" insert -- comprising copper --.

Col. 10, line 43 (claim 11, line 12), change "applyingi" to -- applying --.

Signed and Sealed this

Twentieth Day of March, 2007

JON W. DUDAS
*Director of the United States Patent and Trademark Office*